(12) United States Patent
Pu et al.

(10) Patent No.: US 11,742,864 B2
(45) Date of Patent: Aug. 29, 2023

(54) ADAPTIVE PHASE LOCK LOOP THAT ADJUSTS ITS PHASE DIFFERENCE TARGET

(71) Applicant: Microsoft Technology Licensing, LLC, Redmond, WA (US)

(72) Inventors: Chuan Pu, Foster City, CA (US); Wenjun Liao, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/889,791

(22) Filed: Aug. 17, 2022

(65) Prior Publication Data

US 2022/0393689 A1    Dec. 8, 2022

Related U.S. Application Data

(62) Division of application No. 16/392,578, filed on Apr. 23, 2019, now Pat. No. 11,424,750.

(51) Int. Cl.
| | |
|---|---|
| *H03L 7/099* | (2006.01) |
| *G02B 26/08* | (2006.01) |
| *G02B 26/10* | (2006.01) |
| *H03L 7/085* | (2006.01) |

(52) U.S. Cl.
CPC .......... *H03L 7/099* (2013.01); *G02B 26/0833* (2013.01); *G02B 26/101* (2013.01); *H03L 7/085* (2013.01)

(58) Field of Classification Search
CPC . H03L 7/099; H03L 7/085; H03L 1/00; H03L 7/0802; H03L 2207/06; G02B 26/0833; G02B 26/101
See application file for complete search history.

(56) References Cited

FOREIGN PATENT DOCUMENTS

CN     109639272 A  *  4/2019  ............ H03L 7/085

OTHER PUBLICATIONS

Kuijpers et al. (Towards embedded control for resonant scanning MEMS micromirror, In Proceedings of the Procedia Chemistry, vol. 1, Issue 1, Sep. 1, 2009, pp. 1307-1310) (Year: 2009).*

* cited by examiner

*Primary Examiner* — Kimberly N. Kakalec
(74) *Attorney, Agent, or Firm* — Wade IP Law PLLC

(57) ABSTRACT

Techniques are described herein that are capable of adjusting a center frequency of an adaptive voltage controlled oscillator (VCO) that is included in an adaptive phase lock loop (PLL) and/or a phase difference target of the adaptive PLL. An adaptive PLL is a PLL that includes an adaptive VCO. An adaptive VCO is a VCO that is capable of adjusting its center frequency and/or a phase difference target of the adaptive PLL that includes the adaptive VCO. The adaptive PLL may be configured to drive (e.g., control) a device. A drive signal that is used to drive the device and a resulting output signal that is proportional to movement of the device may be fed back to respective inputs of the adaptive PLL so that the phases of those signals may be processed to facilitate adjustment of the center frequency and/or the phase difference target.

20 Claims, 9 Drawing Sheets

ADAPTIVE PHASE LOCK LOOP THAT ADJUSTS ITS PHASE DIFFERENCE TARGET

CROSS-REFERENCE TO RELATED APPLICATION(S)

This application is a division of U.S. patent application Ser. No. 16/392,578, filed Apr. 23, 2019 and entitled "Adaptive Phase Lock Loop That Adjusts Center Frequency of Voltage Controlled Oscillator Therein," the entirety of which is incorporated by reference herein.

BACKGROUND

A phase lock loop (PLL) is a control system that generates an output signal having a phase that is based at least in part on a phase of an input signal. A PLL typically includes a phase detector, a voltage controlled oscillator (VCO), and a feedback loop. In one relatively simple implementation, the phase detector detects the phase of the input signal and generates a first phase difference to indicate a difference between the phase of a periodic drive signal that drives a device and a phase of a device movement signal. The periodic drive signal and the device movement signal are received via the feedback from the VCO output and the device movement, respectively. In accordance with this implementation, the VCO adjusts the phase and frequency of the output signal based on a second phase difference that indicates a difference between the first phase difference and a phase difference target. In this manner, the PLL may cause the first phase difference to converge toward (e.g., and eventually be substantially the same as) the phase difference target.

SUMMARY

Various approaches are described herein for, among other things, enabling an adaptive phase lock loop (PLL) to adjust a center frequency of an adaptive voltage controlled oscillator (VCO) that is included in the adaptive PLL and/or a phase difference target of the adaptive PLL. An adaptive PLL is a PLL that includes an adaptive VCO. An adaptive VCO is a VCO that is capable of adjusting its center frequency and/or a phase difference target of the adaptive PLL that includes the adaptive VCO. A center frequency of a VCO is a frequency at which the VCO operates (e.g., runs) in response to no input signal being applied to a PLL that includes the VCO. A phase difference target of a PLL is a phase difference to which the PLL is configured to lock (e.g., match, equate) a phase difference that is detected by a phase detector in the PLL. Accordingly, the PLL may attempt to cause the phase difference that is detected by the phase detector to equal the phase difference target. The adaptive PLLs described herein are configured to drive (e.g., control) a device. A drive signal that is used to drive the device and a resulting output signal that is proportional to movement of the device may be fed back to respective inputs of the adaptive PLL so that the phases of those signals may be processed to facilitate adjustment of the center frequency of the adaptive VCO therein and/or the phase difference target of the adaptive PLL.

In an example approach, an adaptive PLL includes a phase detector and an adaptive VCO. The phase detector is configured to detect a first phase difference between a phase of a periodic drive signal and a phase of a reference signal. The periodic drive signal is configured to drive a device. The reference signal is proportional to movement of the device in response to the periodic drive signal. The adaptive VCO is configured to generate the periodic drive signal having a drive frequency that is based at least in part on a center frequency of the adaptive VCO and a frequency difference associated with a phase error signal that is based at least in part on a difference between the first phase difference and a phase difference target of the adaptive PLL. The adaptive VCO is further configured to automatically adjust the center frequency of the adaptive VCO to track a frequency of the periodic drive signal so that the first phase difference is locked to the phase difference target of the adaptive PLL.

In another example approach, an adaptive phase lock loop includes a phase detector and an adaptive VCO. The phase detector is configured to detect a first phase difference between a phase of a periodic drive signal and a phase of a reference signal. The periodic drive signal is configured to drive a device. The reference signal is proportional to movement of the device in response to the periodic drive signal. The adaptive VCO is configured to generate the periodic drive signal having a drive frequency that is based at least in part on a center frequency of the adaptive VCO and a frequency difference corresponding to a second phase difference between a phase difference target of the adaptive PLL and the first phase difference. The adaptive VCO is further configured to automatically adjust the phase difference target of the adaptive PLL to track the first phase difference between the phase of the periodic drive signal and the phase of the reference signal so that the center frequency is maintained at a fixed frequency.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

Figure 1:
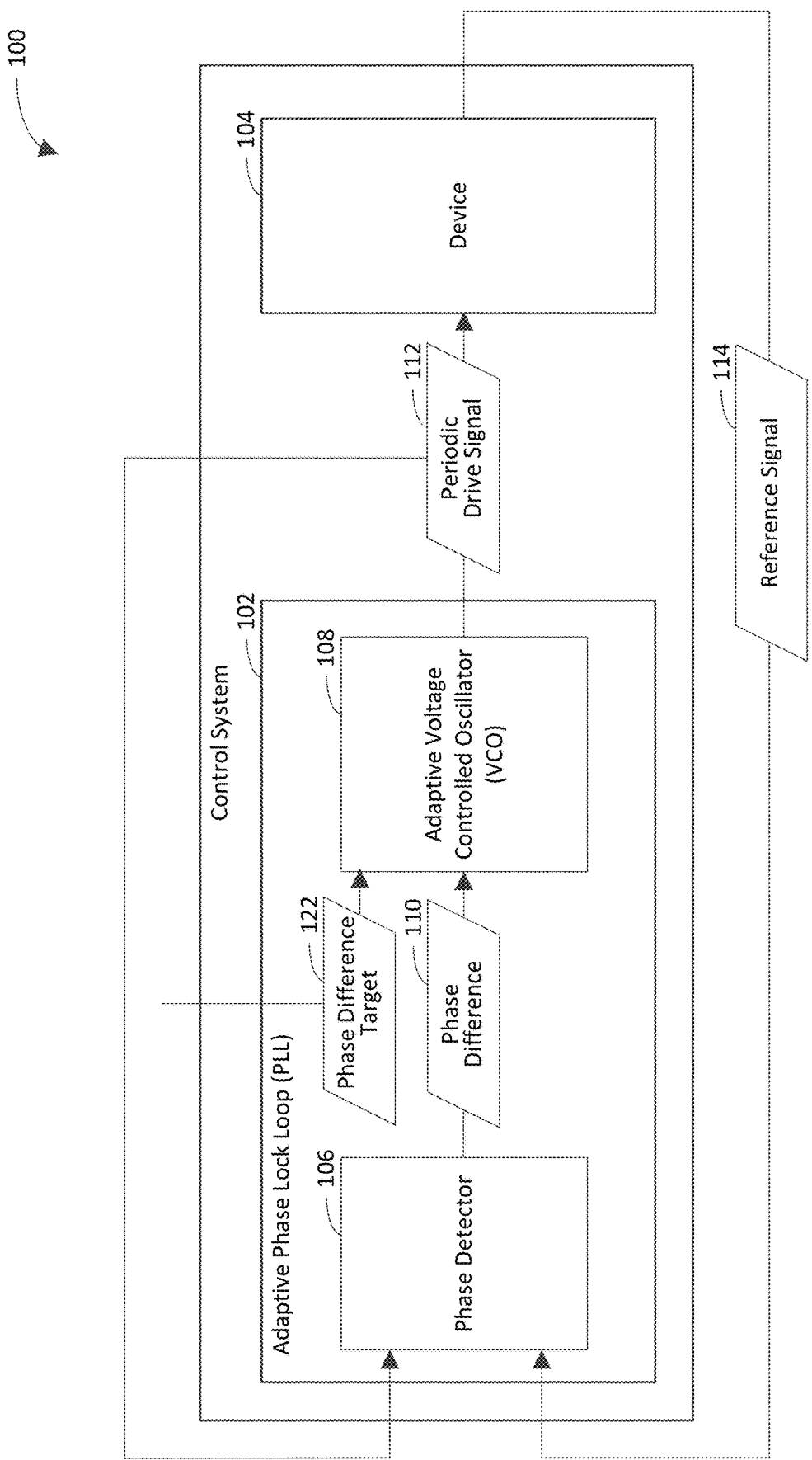
FIG. 1 is a block diagram of an example control system in accordance with an embodiment.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

II. Example Embodiments

Example embodiments described herein are capable of adjusting a center frequency of an adaptive voltage controlled oscillator (VCO) that is included in an adaptive phase lock loop (PLL) and/or a phase difference target of the adaptive PLL. An adaptive PLL is a PLL that includes an adaptive VCO. An adaptive VCO is a VCO that is capable of adjusting its center frequency and/or a phase difference target of the adaptive PLL that includes the adaptive VCO. A center frequency of a VCO is a frequency at which the VCO operates (e.g., runs) in response to no input signal being applied to a PLL that includes the VCO. A phase difference target of a PLL is a phase difference to which the PLL is configured to lock (e.g., match, equate) a phase difference that is detected by a phase detector in the PLL. Accordingly, the PLL may attempt to cause the phase difference that is detected by the phase detector to equal the phase difference target. The adaptive PLLs described herein are configured to drive (e.g., control) a device. A drive signal that is used to drive the device and a resulting output signal that is proportional to movement of the device may be fed back to respective inputs of the adaptive PLL so that the phases of those signals may be processed to facilitate adjustment of the center frequency of the adaptive VCO therein and/or the phase difference target of the adaptive PLL.

Example techniques described herein have a variety of benefits as compared to conventional techniques for locking a frequency of an output signal to a reference frequency and/or locking a detected phase difference to a reference phase difference. For instance, the example techniques may be capable of automatically adjusting a center frequency of an adaptive VCO to track a frequency of a drive signal that is configured to drive a device. Automatically adjusting the center frequency of the adaptive VCO may enable a detected phase difference to be locked to a phase difference target of an adaptive PLL that includes the adaptive VCO. The example techniques may be capable of automatically adjusting a phase difference target of an adaptive PLL to track a detected phase difference between a phase of a periodic drive signal that is configured to drive a device and a phase of a reference signal that is proportional to movement of the device (e.g., that results from the periodic drive signal being applied to the device). Automatically adjusting the phase difference target may enable the center frequency to be fixed (e.g., non-varying). Automatically adjusting the center frequency and/or the phase difference target may be performed by an adaptive PLL to compensate for changes in performance attributes of the adaptive PLL that result from changes in environmental condition(s) (e.g., temperature) of the adaptive PLL.

The example techniques may reduce an amount of power that is consumed by a system to lock a frequency of an output signal to a reference frequency and/or to lock a detected phase difference to a reference phase difference, as compared to conventional techniques. The example techniques may increase an efficiency of such a system. The example techniques may reduce a cost associated with locking the frequency of the output signal to the reference frequency and/or locking the detected phase difference to the reference phase difference. The example techniques may enable an adaptive PLL to maintain resonance of a device that is coupled between an output of the adaptive PLL and an input of the adaptive PLL. For instance, a frequency with which the device resonates (i.e., resonant frequency) may vary depending on environmental factors. The example embodiments may be capable of compensating for such variation of the resonant frequency. Maintaining resonance of the device may reduce an amount of power that is consumed by a system that includes the adaptive PLL, increase efficiency of the system, and/or reduce an operating cost of the system. Adaptive PLLs described herein may operate over a relatively large frequency range, as compared to conventional PLLs.

FIG. 1 is a block diagram of an example control system 100 in accordance with an embodiment. Generally speaking, the control system 100 operates to adjust a phase difference target 122 of an adaptive PLL 102 therein and/or to adjust a center frequency of an adaptive VCO 108 in the adaptive PLL 102 (e.g., to maintain resonance of a device 104 that is coupled between an output of the adaptive PLL 102 and an input of the adaptive PLL 102). As shown in FIG. 1, the control system 100 includes the adaptive PLL 102 and the device 104. It will be understood that the device 104 may include the device and its associated drivers and amplifiers. The adaptive PLL includes a phase detector 106 and the adaptive VCO 108. The phase detector is configured to detect a phase difference 110 between a phase of a periodic drive signal 112 and a phase of a reference signal 114.

The adaptive VCO 108 is configured to generate the periodic drive signal 112 based at least in part on a difference between the phase difference target 122 and the phase difference 110, which is detected by the phase detector 106. The periodic drive signal 112 has a frequency that is based at least in part on a center frequency of the adaptive VCO 108 and a frequency difference associated with the difference between the phase difference target 122 and the phase difference 110. For instance, the adaptive VCO 108 may multiply the difference between the phase difference target 122 and the phase difference 110 by a factor (e.g., gain) to determine the frequency difference. In an example implementation, the adaptive VCO 108 generates the periodic drive signal 112 to have a frequency that is based at least in part on a voltage associated with the difference between the phase difference target 122 and the phase difference 110. In accordance with this implementation, the voltage may represent the difference between the phase difference target 122 and the phase difference 110. The adaptive VCO 110 may generate the periodic drive signal 112 to drive (e.g., operate, control) the device 104. The periodic drive signal 112 is fed back from an output of the adaptive PLL 102 (e.g., an output of the adaptive VCO 108) to an input of the adaptive PLL 102 (e.g., an input of the phase detector 106) for comparison with the reference signal 114.

In a "center frequency adjustment" implementation (described in further detail below with reference to FIGS. 2 and 4-5), the adaptive VCO 108 is further configured to automatically adjust the center frequency of the adaptive VCO 108 to track a frequency of the periodic drive signal 112. By causing the center frequency of the adaptive VCO 108 to track the frequency of the periodic drive signal 112, the adaptive VCO 108 may enable the phase difference 110 that is detected by the phase detector 106 to be (e.g., remain) locked to the phase difference target 122 (e.g., 90 degrees) of the adaptive PLL 102. In an example embodiment, the adaptive VCO 108 is configured to maintain resonance of the device 104 by automatically adjusting the center frequency of the adaptive VCO 108 to track the frequency of the periodic drive signal 112 (e.g., so that the detected phase difference 110 detected by the phase detector 106 is locked to the phase difference target 122 of the adaptive PLL 102). The "center frequency adjustment" implementation may be employed, for example, if the direct input and the direct output of the device 104 are capable of being monitored. For instance, by monitoring both the direct input and the direct output of the device 104, a determination may be made as to whether a detected phase shift is attributable to the device 104.

In a "phase difference target adjustment" implementation (described in further detail below with reference to FIGS. 6-8), the frequency difference upon which the frequency of the periodic drive signal 112 is based corresponds to a phase difference between the phase difference target 122 of the adaptive PLL 102 and the phase difference 110 that is detected by the phase detector 106. In accordance with this implementation, the adaptive VCO 108 is further configured to automatically adjust the phase difference target of the adaptive PLL 102 to track the phase difference 110. By causing the phase difference target 122 of the adaptive PLL 102 to track the phase difference 110, the adaptive VCO 1108 may enable the center frequency of the adaptive VCO 108 to be maintained at a fixed (e.g., constant) frequency. The "phase difference target adjustment" implementation may be employed, for example, if the direct input of the device 104 is not capable of being monitored (e.g., and the direct output of the device 104 is capable of being monitored). For example, a driver for the device 104 may introduce an additional feature (e.g., a phase shift). In this example, the phase of the device 104 may not have shifted, but the phase of the driver may have shifted, causing the phase difference between the phase of the driver and the phase of the device 104 to change.

Although the adaptive PLL 102 may be particularly useful for control systems that include components operating at resonance, it will be recognized that the adaptive PLL 102 may be applied to any suitable adaptive frequency and/or phase control. The adaptive PLL 102 may have the benefits of design simplicity, flexibility, robust performance, and wide applications.

The adaptive PLL 102 (or one or more components therein) may be implemented in various ways to adjust its phase difference target 122 and/or the center frequency of the adaptive VCO 108, including being implemented in hardware, software, firmware, or any combination thereof. For example, the adaptive PLL 102 may be implemented as computer program code configured to be executed in one or more processors. In another example, the adaptive PLL 102 may be implemented as hardware logic/electrical circuitry. For instance, the adaptive PLL 102 may be implemented in a field-programmable gate array (FPGA), an application-specific integrated circuit (ASIC), an application-specific standard product (ASSP), a system-on-a-chip system (SoC), a complex programmable logic device (CPLD), etc. Each SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

The device 104 is configured to move (e.g., oscillate, resonate) in response to receipt of the periodic drive signal 112. For instance, movement of the device 104 may be based at least in part on an amplitude, frequency, and/or phase of the periodic drive signal 112. For example, if the periodic drive signal 112 causes the device 104 to resonate, a distance over which the device resonates may depend on a difference between the frequency of the periodic drive signal 112 and the resonant frequency of the device 104. In accordance with this example, a lesser difference between the frequency of the periodic drive signal 112 and the resonant frequency of the device 104 may cause the device 104 to oscillate through a relatively greater distance; whereas, a greater difference between the frequency of the periodic drive signal 112 and the resonant frequency of the device 104 may cause the device 104 to oscillate through a relatively lesser distance. Accordingly, the control system 100 achieves a relatively high power efficiency when the frequency of the periodic drive signal 112 is equal to the resonant frequency of the device 104.

The reference signal 114, which the phase detector 106 uses to generate the phase difference 110, is proportional to the movement of the device 104. For example, the device 104 may generate the reference signal 114 to represent the movement of the device 104. In another example, a sensor (e.g., motion sensor) that is separate from the device 104 may be configured to generate the reference signal 114 in response to detecting the movement of the device 104. In both examples, the reference signal 114 is fed back to an input of the adaptive PLL 102 (e.g., an input of the phase detector 106) for comparison with the periodic drive signal 112.

In an example embodiment, the device 104 is a scan microelectromechanical systems (MEMS) mirror. In accordance with this embodiment, the scan MEMS mirror is configured to generate the reference signal 114 by oscillating about an axis in response to the periodic drive signal 112. For example, the scan MEMS mirror may oscillate about the axis to reflect light for display. In accordance with this example, the control system 200 may further include a light source (e.g., a laser light source) that is configured to generate the light that is reflected by the scan MEMS mirror. In an aspect of this embodiment, the scan MEMS mirror may be a fast scan MEMS mirror. In accordance with this aspect, the control system 200 may further include a slow scan MEMS mirror that is configured to oscillate about an axis that is perpendicular to the axis about which the fast scan MEMS mirror is configured to oscillate. In further accordance with this aspect, the fast scan MEMS mirror and the slow scan MEMS mirror are configured to collaboratively perform a raster scan of light for display. The fast scan MEMS mirror may scan at a relatively fast scan rate (e.g., in a range from 10 kilohertz (kHz) to 40 kHz), and the slow scan MEMS mirror may scan at a relatively slow scan rate (e.g., in a range from 50 hertz (Hz) to 200 Hz). It will be recognized that the final design of the adaptive VCO 108 may be chosen based on the final FS MEMS and driver design, though the scope of the example embodiments is not limited in this respect.

It will be recognized that the control system 100 may include components in addition to or in lieu of the adaptive PLL 102, the device 104, the phase detector 106, and/or the adaptive VCO 108.

Figure 2:
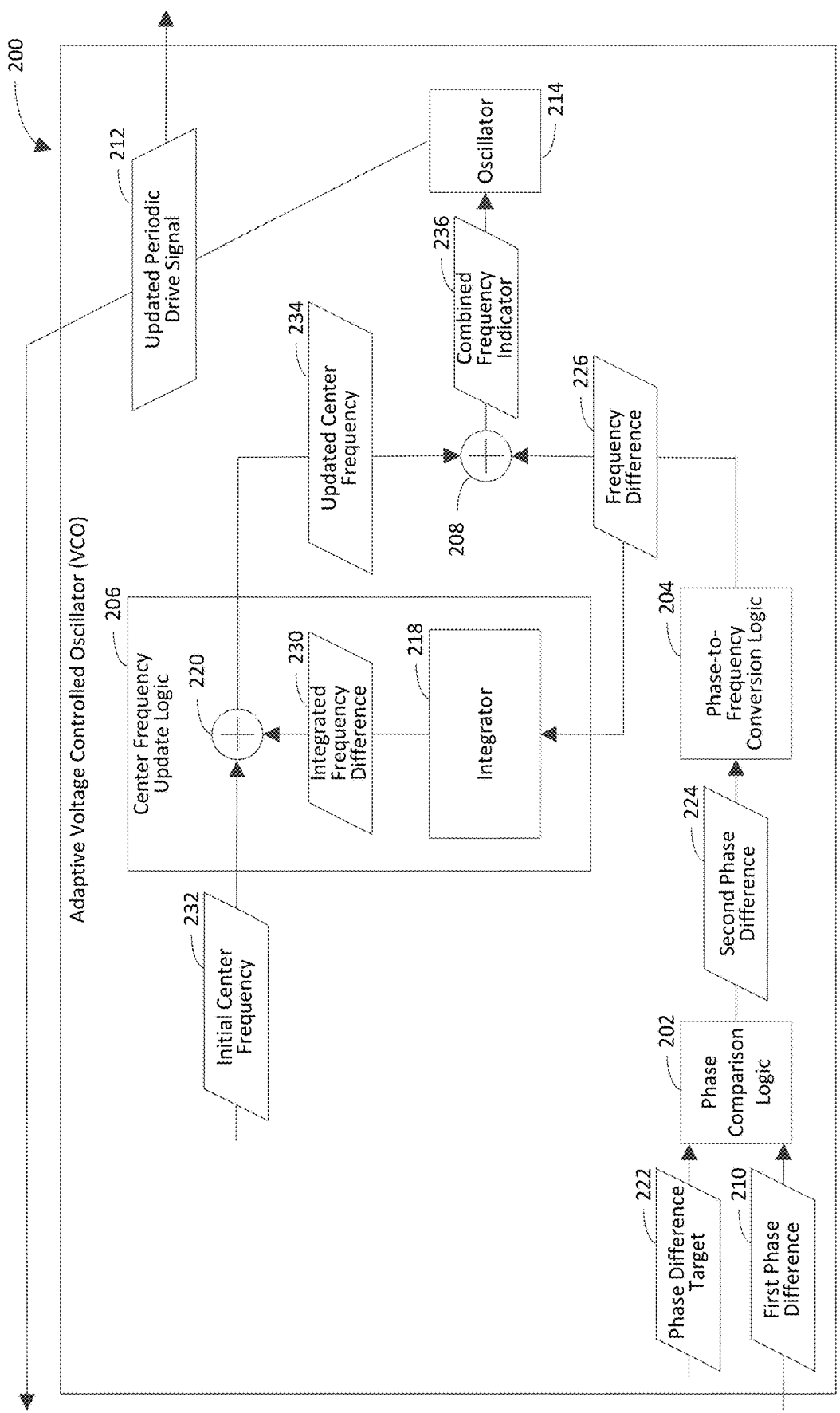
FIGS. 2 and 6 are block diagrams of example implementations of an adaptive VCO shown in FIG. 1 in accordance with embodiments.

FIG. 2 is a block diagram of an example adaptive VCO 200, which is an example implementation of the adaptive VCO 108 shown in FIG. 1, in accordance with an embodiment. As shown in FIG. 2, the adaptive VCO 200 includes phase comparison logic 202, phase-to-frequency conversion logic 204, center frequency update logic 206, a first combiner 208, and an oscillator 214. The phase comparison logic 202 receives a phase difference target 222 from a master control loop with which the adaptive VCO is associated. The phase comparison logic 202 also receives a first phase difference 210 from a phase detector (e.g., phase detector 106 of FIG. 1). The phase comparison logic 202 compares the phase difference target 222 and the first phase difference 210 to determine a second phase difference 224 therebetween.

The phase-to-frequency conversion logic 204 determines a frequency difference 226 that corresponds to the second phase difference 224. For instance, the phase-to-frequency conversion logic 204 may multiply the second phase difference 224 by a factor (e.g., a constant) to determine the frequency difference 226.

The center frequency update logic 206 determines an updated center frequency 234 of the adaptive VCO 200 based at least in part on an initial center frequency 232 of the adaptive VCO 200 and the frequency difference 226. The center frequency update logic 206 includes an integrator 218 and a second combiner 220. The integrator 218 (in fact, the adaptive VCO 200 as a whole) operates in an iterative manner. For each iteration, the integrator 218 integrates the frequency difference 226 (i.e., the currently determined frequency difference) with previously determined frequency differences once the frequency difference 226 has stabilized to provide an integrated frequency difference 230. For instance, the frequency difference 226 may be deemed to be stabilized based at least in part on the frequency difference 226 varying less than or equal to a threshold amount (e.g., 10%, 5%, 1%, or 0.5%) and/or a threshold period of time (e.g., 1 second, 0.5 seconds, 0.2 seconds, or 0.1 seconds) passing since the frequency difference 226 was initially received by the integrator 218. For each iteration, the second combiner 220 combines (e.g., adds) the initial center frequency 232 and the integrated frequency difference 230 to provide (e.g., generate) the updated center frequency 234.

In an example embodiment, the frequency difference 226 is down-sampled to give the frequency difference 226 time to stabilize prior to the frequency difference 226 being integrated with the previously determined frequency differences by the integrator 218. In accordance with this embodiment, the integrated frequency difference 230 is up-sampled in response to the frequency difference 226 being integrated with the previously determined frequency differences.

The first combiner 208 combines (e.g., adds) the updated center frequency 234 and the frequency difference 226 to provide a combined frequency indicator 236. Because the frequency difference 226 takes time to stabilize, the integrated frequency difference 230 that is generated by the integrator 218 may not take into consideration the frequency difference 226 (i.e., the currently determined frequency difference) during a current iteration. For instance, the frequency difference 226 may not have had sufficient time to stabilize during the current iteration. Accordingly, the updated center frequency 234 for the current iteration may not take into consideration the frequency difference 226. Thus, the first combiner 208 may be used to ensure that the combined frequency indicator 236 takes into consideration the frequency difference 226.

The oscillator 214 generates an updated periodic drive signal 212 based at least in part on the combined frequency indicator 236. For instance, the oscillator 214 may generate the updated periodic drive signal 212 to have a frequency equal to a sum of the updated center frequency 234 and the frequency difference 226 in response to receipt of the combined frequency indicator 236. The updated periodic drive signal 212 is configured to drive a device (e.g., device 104). For example, the updated periodic drive signal 212 may be configured to cause the device to operate at a resonant frequency of the device. In accordance with this example, the frequency of the updated periodic drive signal 212 may be equal to the resonant frequency of the device.

It will be recognized that the adaptive VCO 200 may not include one or more of the phase comparison logic 202, the phase-to-frequency conversion logic 204, the center frequency update logic 206, the first combiner 208, the oscillator 214, the integrator 218, and/or the second combiner 220. Furthermore, the adaptive VCO 200 may include components in addition to or in lieu of the phase comparison logic 202, the phase-to-frequency conversion logic 204, the center frequency update logic 206, the first combiner 208, the oscillator 214, the integrator 218, and/or the second combiner 220.

Some example functionality of the adaptive VCO 200 will now be described in the context of tracking a resonant frequency of a fast scan (FS) MEMS mirror in a laser beam scanning display for non-limiting illustrative purposes. In this context, the device that is driven by the updated periodic drive signal 212 is the FS MEMS mirror. The example functionality of the adaptive VCO 200 will be contrasted with the functionality of a VCO that does not utilize the adaptive techniques described herein to facilitate the discussion.

It will be recognized that resonance of the FS MEMS mirror may be controlled with a PLL because the resonance of the FS MEMS mirror may correspond to a fixed phase difference, p, between a phase of a drive signal that drives the FS MEMS mirror and a phase of a signal that is proportional to the position of the FS MEMS mirror. For instance, the fixed phase difference may be ninety degrees with a linear driver. The PLL may lock down the phase difference, p, to ensure the resonance of the FS MEMS mirror. The VCO in the PLL may vary a frequency of the drive signal around the center frequency, f0, of the VCO with a feedback gain, b. The frequency, f, of the drive signal may be represented as follows:

$$f = f0 + b*(p-p0) \quad \text{(Equation 1)}$$

where p0 is the phase difference target of the PLL.

When the center frequency, f0, of the VCO corresponds to the resonant frequency of the FS MEMS mirror and the phase difference target, p0, of the PLL corresponds to the phase difference, p, the feedback loop forces the VCO to drive the FS MEMS mirror at the frequency at which the FS MEMS mirror oscillates.

Figure 3:
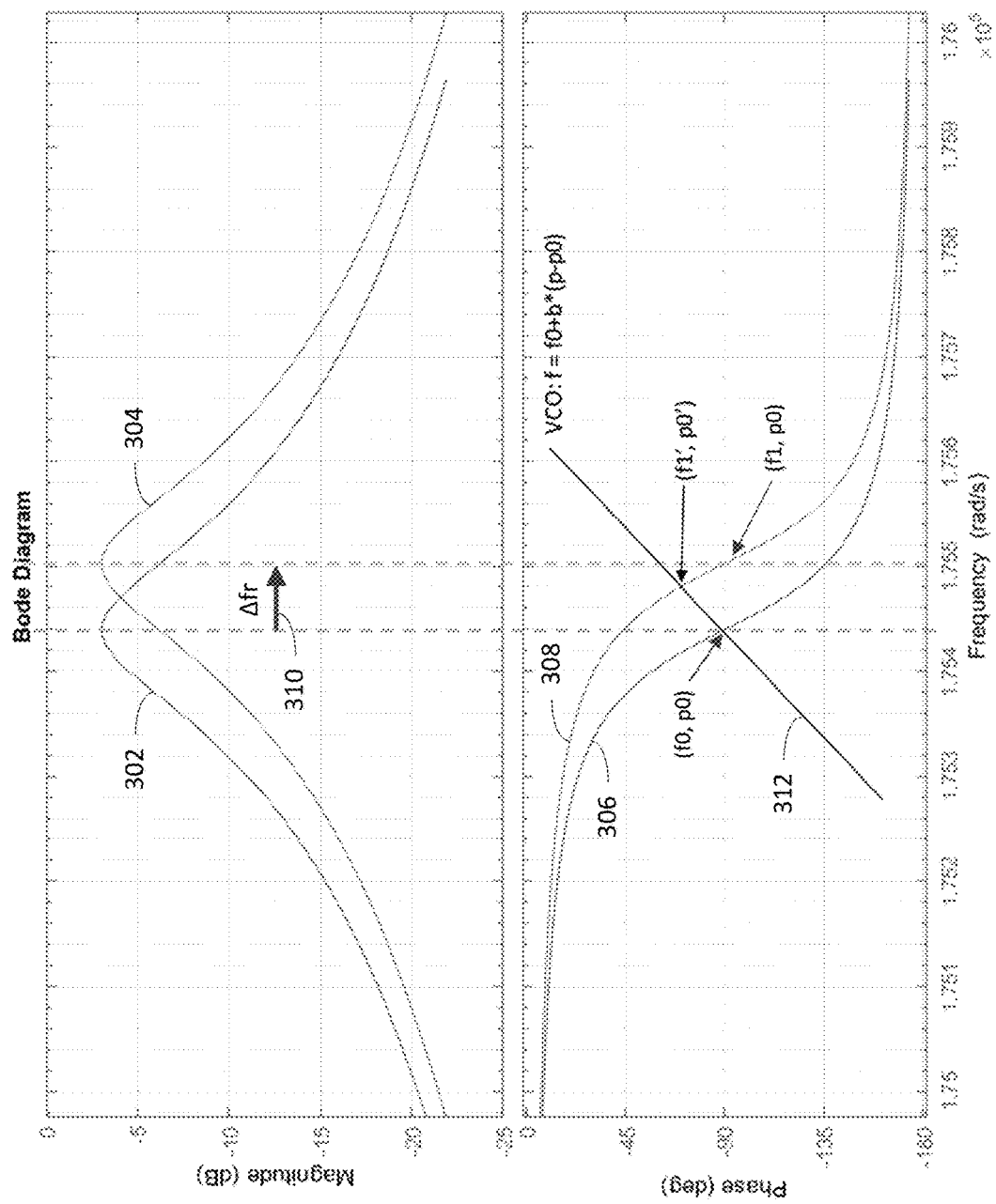
FIG. 3 is an example bode plot.

FIG. 3 is an example bode plot 300 of a frequency response of the FS MEMS mirror illustrating interaction of the FS MEMS mirror operating under resonance and a VCO that does not utilize the adaptive techniques described herein. Curves 302 and 306 represent the frequency response (amplitude and phase, respectively) of the FS MEMS mirror prior to a shift of the resonant frequency of the VCO. Curves 304 and 308 represent the frequency response (amplitude and phase, respectively) of the FS MEMS mirror after the resonant frequency of the VCO shifts by an amount, Δfr, as illustrated by arrow 310. Line 312 represents a relationship between the frequency, f, of the drive signal and a difference between the phase difference, p, and the phase difference target, p0.

As shown in FIG. 3, a control system that includes the VCO stabilizes at a point of resonance (f0, p0), which is defined by an intersection of curve 306 and line 310. In practice the resonant frequency of the FS MEMS mirror may change with time and environment (e.g., from f0 to f1 as shown in FIG. 3). The VCO adjusts the frequency, f, of the drive signal to follow this shift. However, the VCO converges at (f1', p0') where curve 308 with (f1, p0) and line 312 with (f0, p0, b) intersect. Because f1'≠f1, the FS MEMS mirror is not operating at its current resonance of f1. This may result in (a) high power consumption as higher amplifier gain is needed to maintain the FS MEMS mirror open angle, (b) degraded display image quality as the operation frequency of the FS MEMS mirror is away from resonance, and (c) the PLL potentially not converging if the resonance drifts outside the operation frequency range of the PLL.

To address these points, the properties (e.g., resonant frequency) of the FS MEMS mirror may be constantly monitored, and control parameters (e.g., driving frequency, filter index, and amplitude gain) may be adjusted accordingly. However, a variety of challenges exist with such an approach. For instance, variations in the properties of the FS MEMS mirror are unpredictable, which may necessitate measuring the properties first and then adjusting control parameters very accurately and quickly. These calculations may be complicated and power consuming, and the control may not be robust.

Accordingly, the adaptive VCO 200 may be used to automatically adjust the center frequency, f0, of the adaptive VCO 200 with the resonant frequency of the FS MEMS mirror. The adaptive PLL that includes the VCO 200 may be capable of tracking the resonant frequency shift at the fixed phase shift (e.g., 90 degrees) in a relatively wide (e.g., unlimited) range and without a need to measure the resonant frequency shift of the FS MEMS mirror.

Figure 4:
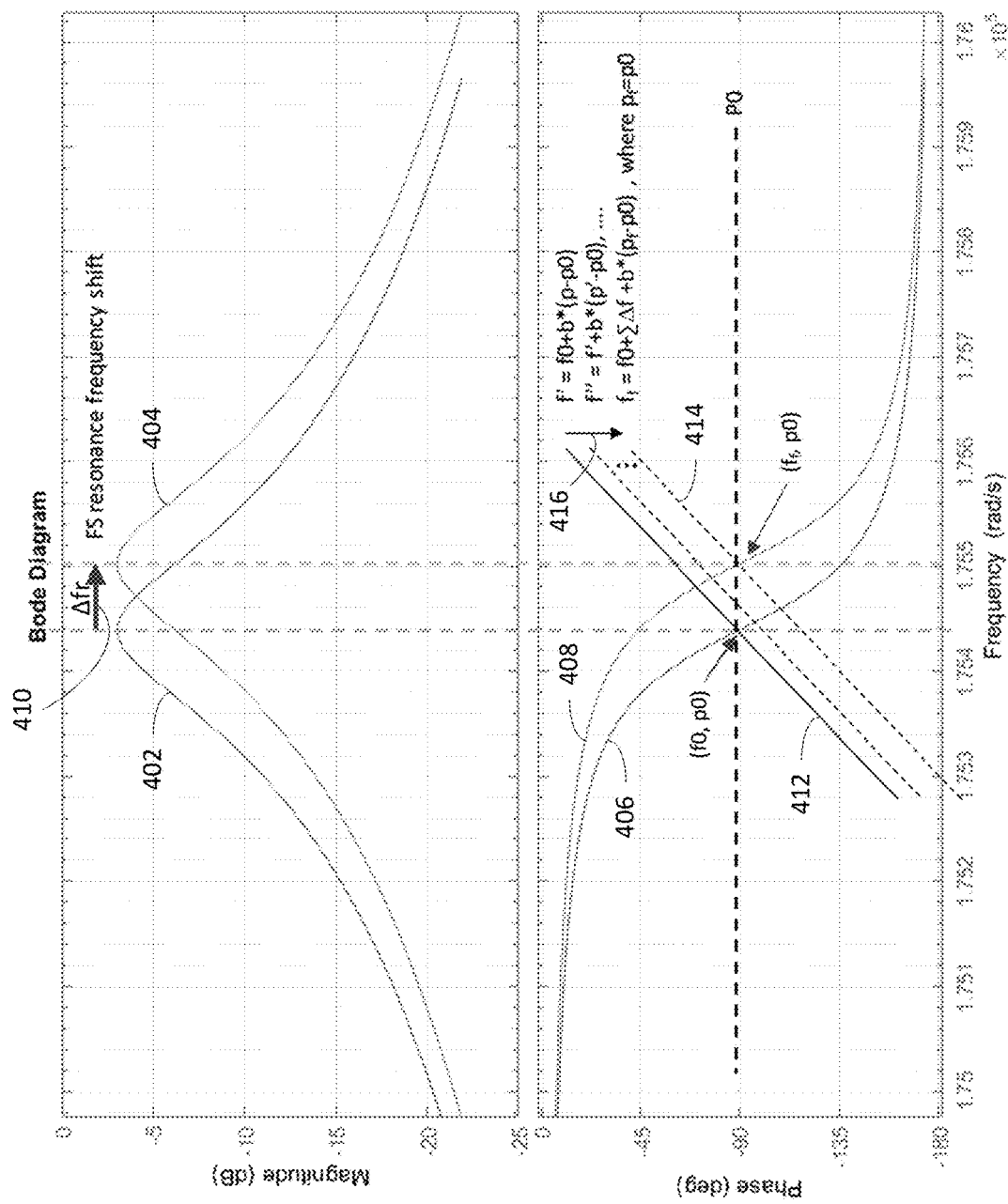
FIGS. 4 and 7 are example bode plots in accordance with embodiments.

FIG. 4 is an example bode plot of a frequency response of the FS MEMS mirror illustrating interaction of the FS MEMS mirror operating under resonance and the adaptive VCO 200 shown in FIG. 2 in accordance with an embodiment. Curves 402 and 406 represent the frequency response (amplitude and phase, respectively) of the FS MEMS mirror prior to a shift of the resonant frequency of the FS MEMS mirror. Curves 404 and 408 represent the frequency response (amplitude and phase, respectively) of the FS MEMS mirror after the resonant frequency of the FS MEMS mirror shifts by an amount, Δfr, as illustrated by arrow 410. Line 412 represents a relationship between the frequency, f, of the updated periodic drive signal 212 and a difference between the phase difference, p (between the phase of the updated periodic drive signal 212 and the phase corresponding to the position of the FS MEMS mirror) and the phase difference target, p0 (i.e., phase difference target 122).

As shown in FIG. 4, instead of having a fixed point of resonance (f0, p0) of the PLL as depicted in FIG. 3, the center frequency of the adaptive VCO 200 is updated during the PLL feedback process by integrating the frequency changes:

$$f' = f0 + \Delta f, \text{ where } \Delta f = b*(p - p0) = b*\Delta p$$

$$f'' = f' + \Delta f', \text{ where } \Delta f' = b*(p' - p0) = b*\Delta p'$$

$$\rightarrow f'' = f0 + \Delta f + \Delta f' = f0 + b*(\Delta p + \Delta p')$$

$$\ldots$$

$$f_f = f0 + \sum \Delta f = f0 + b* \sum \Delta p, \text{ and } p_f = p0$$

Accordingly, line 412 is adaptively shifted toward line 414 one step at a time, as indicated by arrow 416. $f_f$ converges when $\Delta f_f = 0$ and $p_f = p0$ for the locked output phase. Because the new resonance of the FS MEMS mirror is (f1, p0), this ensures $f_f = f1$.

As described above with reference to FIG. 2, the adaptive VCO 200 uses a difference between the first phase difference 210, which is received from the phase detector (e.g., phase detector 106), and the phase difference target 222 to adjust the center frequency of the adaptive VCO 200 in real-time (e.g., on the fly). With a phase difference target of ninety degrees, the center frequency of the adaptive VCO 200 converges to the resonant frequency of the FS MEMS mirror (i.e., $f_f = f1$), and the adaptive VCO 200 uses the new center frequency for its new frequency range within which to converge. This adaptation may ensure that the PLL is functional and that the FS MEMS mirror works at its resonant frequency.

In an example embodiment, the functionality of the VCO 200 may be summarized by the following steps:
1. The adaptive VCO 200 starts at the initial center frequency f0 as a regular VCO. After a period of time t0, the output of the adaptive VCO 200 stabilizes with output f0+Δf, where Δf is the error frequency from the error signal (i.e., frequency difference 226).
2. The center frequency update logic 206 starts and updates the new center frequency to f'=f0+Δf.
3. The regular VCO starts again and stabilizes at f''=f'+Δf'.
4. Step 2 and 3 are repeated. Effectively, the integrator sums Δf+Δf' and updates the center frequency to: f0+Δf+Δf' . . . =$f_0$+ΣΔf. This process converges when the error signal goes to 0, and the final center frequency, $f_f$, of the adaptive VCO 200 equals the current resonant frequency, f1, of the FS MEMS mirror (i.e., $f_f = f1$).

It should be noted that the functionality of the adaptive VCO 200 is not limited to any initial (f0, p0) (resonance is merely one example) or any specific technique for integrating the frequency differences that are determined by the phase-to-frequency conversion logic 204.

Figure 5:
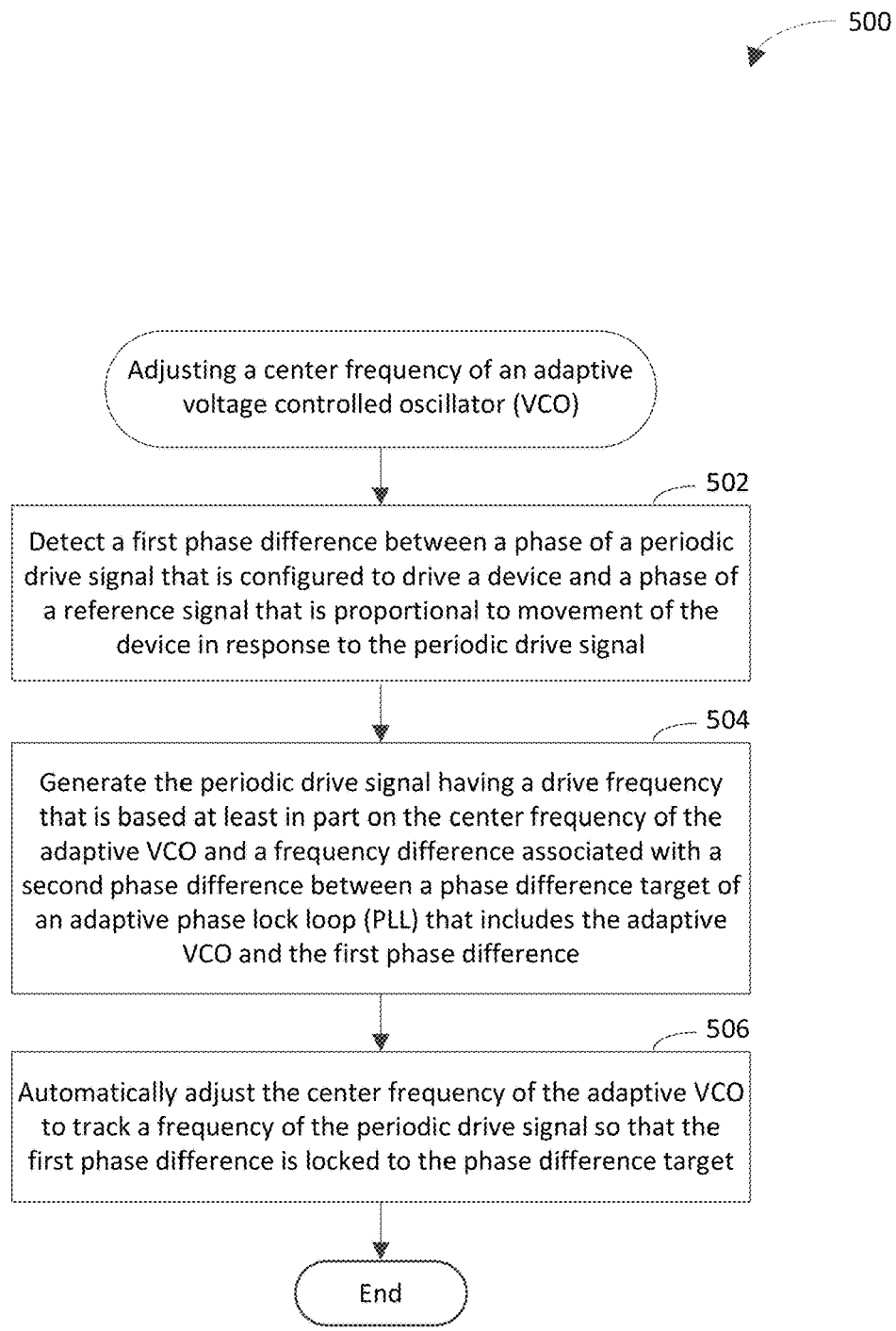
FIG. 5 depicts a flowchart of an example method for adjusting a center frequency of an adaptive VCO in accordance with an embodiment.

FIG. 5 depicts a flowchart 500 of an example method for adjusting a center frequency of an adaptive VCO in accordance with an embodiment. Flowchart 500 may be performed by the adaptive PLL 102 shown in FIG. 1, for example. For illustrative purposes, flowchart 500 is described with respect to the adaptive PLL 102 and the adaptive VCO 200 shown in FIG. 2, which is an example implementation of the adaptive VCO 108 in the adaptive PLL 102. Further structural and operational embodiments will be apparent to persons skilled in the relevant art(s) based on the discussion regarding flowchart 500.

As shown in FIG. 5, the method of flowchart 500 begins at step 502. In step 502, a first phase difference between a phase of a periodic drive signal that is configured to drive a device and a phase of a reference signal that is proportional to movement of the device in response to the periodic drive signal is detected. In an example implementation, the phase detector 106 detects the first phase difference 110 between a phase of the periodic drive signal 112 that is configured to drive the device 104 and a phase of the reference signal 114 that is proportional to movement of the device 104 in response to the periodic drive signal 112.

At step 504, the periodic drive signal is generated having a drive frequency that is based at least in part on the center frequency of the adaptive voltage controlled oscillator and a frequency difference associated with a second phase difference between a phase difference target of an adaptive phase lock loop that includes the adaptive voltage controlled oscillator and the first phase difference. In an example implementation, the adaptive VCO 200 generates the periodic drive signal 112 having the drive frequency that is based at least in part on the center frequency of the adaptive VCO 200 and a frequency difference associated with the second phase difference 224 between the phase difference target 122 of the adaptive PLL 102 and the first phase difference 110.

In an example embodiment, generating the periodic drive signal at step 504 includes causing the device to operate at a resonant frequency of the device. For instance, the drive frequency may be substantially equal to the resonant frequency of the device.

At step 506, the center frequency of the adaptive voltage controlled oscillator is automatically adjusted to track a frequency of the periodic drive signal so that the first phase difference is locked to the phase difference target. In an example implementation, the adaptive VCO 200 automatically adjusts the center frequency of the adaptive VCO 200 to track a frequency of the periodic drive signal 112 so that the first phase difference 210 is locked to the phase difference target 222.

In an example embodiment, automatically adjusting the center frequency at step 506 includes integrating iterative representations of the frequency difference associated with respective iterative representations of the second phase difference to provide an integrated frequency difference. For instance, the integrator 218 may integrate the iterative representations of the frequency difference 226 associated with the respective iterative representations of the second phase difference 224 to provide the integrated frequency difference 230. In accordance with this embodiment, automatically adjusting the center frequency at step 506 further includes combining an initial representation of the center frequency of the adaptive voltage controlled oscillator and the integrated frequency difference to provide an updated representation of the center frequency of the adaptive voltage controlled oscillator. For instance, the second combiner 220 may combine the initial center frequency 232 of the adaptive VCO 200 and the integrated frequency difference 230 to provide the updated center frequency 234 of the adaptive VCO 200.

In an aspect of this embodiment, automatically adjusting the center frequency at step 506 further includes combining the updated representation of the center frequency of the adaptive voltage controlled oscillator and a representation of the frequency difference that is based at least in part on the phase of the updated representation of the center frequency of the adaptive voltage controlled oscillator to provide combined frequencies. For instance, the first combiner 208 may combine the updated center frequency 234 of the adaptive VCO 200 and a representation of the frequency difference 226 that is based at least in part on the phase of the updated center frequency 234 to provide the combined frequency indicator 236, which indicates the combined frequencies. In accordance with this aspect, generating the periodic drive signal at step 504 includes generating an updated representation of the periodic drive signal based at least in part on the combined frequencies. For instance, the oscillator 214 may generate the updated periodic drive signal 212 based at least in part on the combined frequencies.

In another example embodiment, automatically adjusting the center frequency at step 506 includes maintaining resonance of the device by automatically adjusting the center frequency of the adaptive voltage controlled oscillator to track the frequency of the periodic drive signal so that the first phase difference is locked to the phase difference target.

In some example embodiments, one or more steps 502, 504, and/or 506 of flowchart 500 may not be performed. Moreover, steps in addition to or in lieu of steps 502, 504, and/or 506 may be performed.

Figure 6:
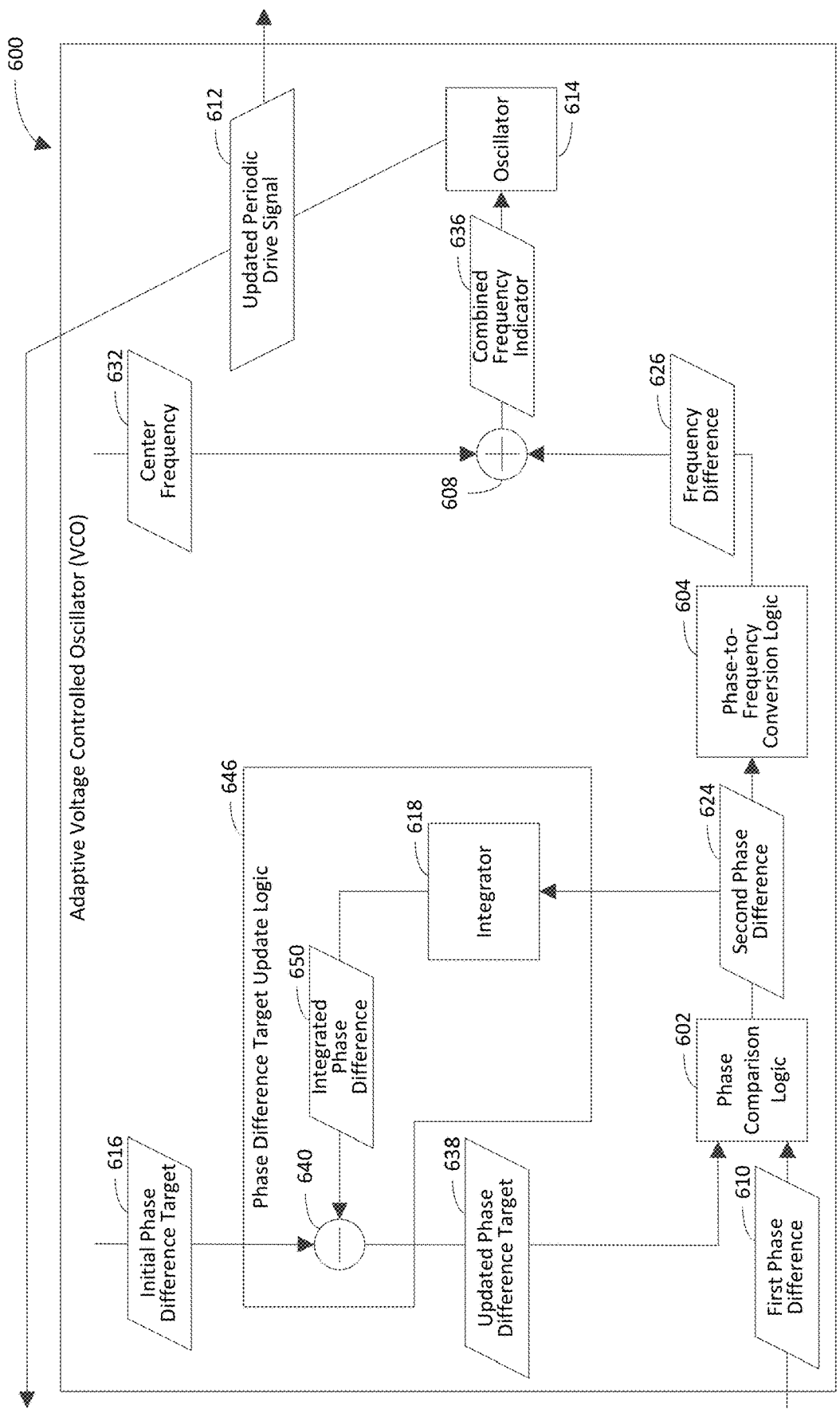

FIG. 6 is a block diagram of an example adaptive VCO 600, which is another example implementation of the adaptive VCO 108 shown in FIG. 1, in accordance with an embodiment. As shown in FIG. 6, the adaptive VCO 600 includes phase comparison logic 602, phase-to-frequency conversion logic 604, a first combiner 608, an oscillator 614, and phase difference target update logic 646. The phase difference target update logic 646 determines an updated phase difference target 638 of an adaptive PLL (e.g., adaptive PLL 102 of FIG. 1) that includes the adaptive VCO 600 based at least in part on an initial phase difference target 616 of the adaptive PLL and a second phase difference 624 that is determined by the phase comparison logic 602. The second phase difference 624 is discussed in further detail below with reference to the phase comparison logic 602.

The phase difference target update logic 646 includes an integrator 618 and a second combiner 640. The integrator 618 (in fact, the adaptive VCO 600 as a whole) operates in an iterative manner. For each iteration, the integrator 618 integrates the second phase difference 624 (i.e., the currently determined phase difference) with previously determined phase differences once the second phase difference 624 has stabilized to provide an integrated phase difference 650. For instance, the second phase difference 624 may be deemed to be stabilized based at least in part on the second phase difference 624 varying less than or equal to a threshold amount (e.g., 10%, 5%, 1%, or 0.5%) and/or a threshold period of time (e.g., 1 second, 0.5 seconds, 0.2 seconds, or 0.1 seconds) passing since the second phase difference 624 was initially received by the integrator 618. For each iteration, the second combiner 640 combines the initial phase difference target 616 and the integrated phase difference 650 to provide (e.g., generate) the updated phase difference target 638. For instance, the second combiner 640 may subtract the integrated phase difference 650 from the initial phase difference target 616 to provide the updated phase difference target 638.

In an example embodiment, the second phase difference 624 is down-sampled to give the second phase difference 624 time to stabilize prior to the second phase difference 624 being integrated with the previously determined phase differences by the integrator 618. In accordance with this embodiment, the integrated phase difference 650 is up-sampled in response to the second phase difference 624 being integrated with the previously determined phase differences.

The phase comparison logic 602 receives the updated phase difference target 638 from the phase difference target update logic 646. The phase comparison logic 602 also receives a first phase difference 610 from a phase detector (e.g., phase detector 106 of FIG. 1). The phase comparison logic 602 compares the updated phase difference target 638 and the first phase difference 610 to determine the second phase difference 624 that is provided to the integrator 618 for processing.

The phase-to-frequency conversion logic 604 determines a frequency difference 626 that corresponds to the second phase difference 624. For instance, the phase-to-frequency conversion logic 604 may multiply the second phase difference 624 by a factor (e.g., a constant) to determine the frequency difference 626.

The first combiner 608 combines (e.g., adds) a center frequency 632 of the adaptive VCO 600 and the frequency difference 626 to provide a combined frequency indicator 636.

The oscillator 614 generates an updated periodic drive signal 612 based at least in part on the combined frequency indicator 636. For instance, the oscillator 614 may generate the updated periodic drive signal 612 to have a frequency equal to a sum of the center frequency 632 of the VCO 600 and the frequency difference 626 in response to receipt of the combined frequency indicator 636. The updated periodic drive signal 612 is configured to drive a device (e.g., device 104). For example, the updated periodic drive signal 612 may be configured to cause the device to operate at a resonant frequency of the device. In accordance with this example, the frequency of the updated periodic drive signal 612 may be equal to the resonant frequency of the device.

It will be recognized that the adaptive VCO 600 may not include one or more of the phase comparison logic 602, the phase-to-frequency conversion logic 604, the first combiner 608, the oscillator 614, the integrator 618, the second combiner 640, and/or the phase difference target update logic 646. Furthermore, the adaptive VCO 600 may include components in addition to or in lieu of the phase comparison logic 602, the phase-to-frequency conversion logic 604, the first combiner 608, the oscillator 614, the integrator 618, the second combiner 640, and/or the phase difference target update logic 646.

Some example functionality of the adaptive VCO 600 will now be described in the context of tracking a resonant frequency of a FS MEMS mirror in a laser beam scanning display for non-limiting illustrative purposes. In this context, the device that is driven by the updated periodic drive signal 612 is the FS MEMS mirror. The example functionality of the adaptive VCO 600 will be contrasted with the functionality of a VCO that does not utilize the adaptive techniques described herein to facilitate the discussion. It is noted that the functionality of a VCO that does not utilize the adaptive techniques described herein is described above with reference to FIG. 3.

The adaptive VCO 600 may be used to automatically adjust the phase difference target of the adaptive PLL that includes the VCO 600 with the resonance phase shift of the FS MEMS mirror. The adaptive PLL may be capable of tracking the resonance phase shift for a fixed frequency target (i.e., a fixed center frequency of the adaptive VCO 600) in a relatively wide (e.g., unlimited) range and without a need to measure the resonance phase shift of the FS MEMS mirror.

Figure 7:
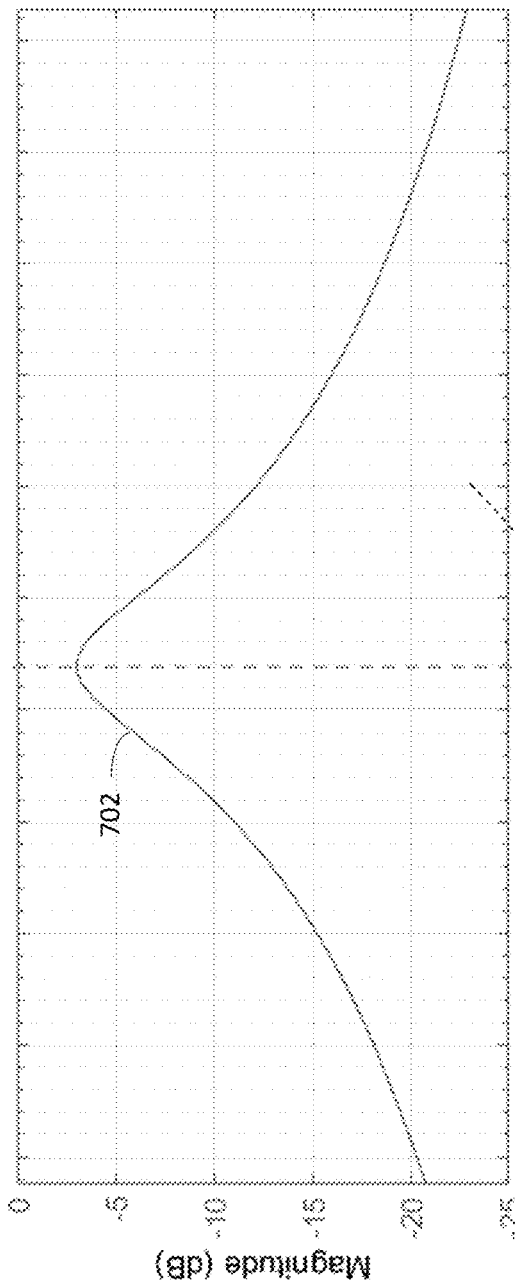
Figure 7:
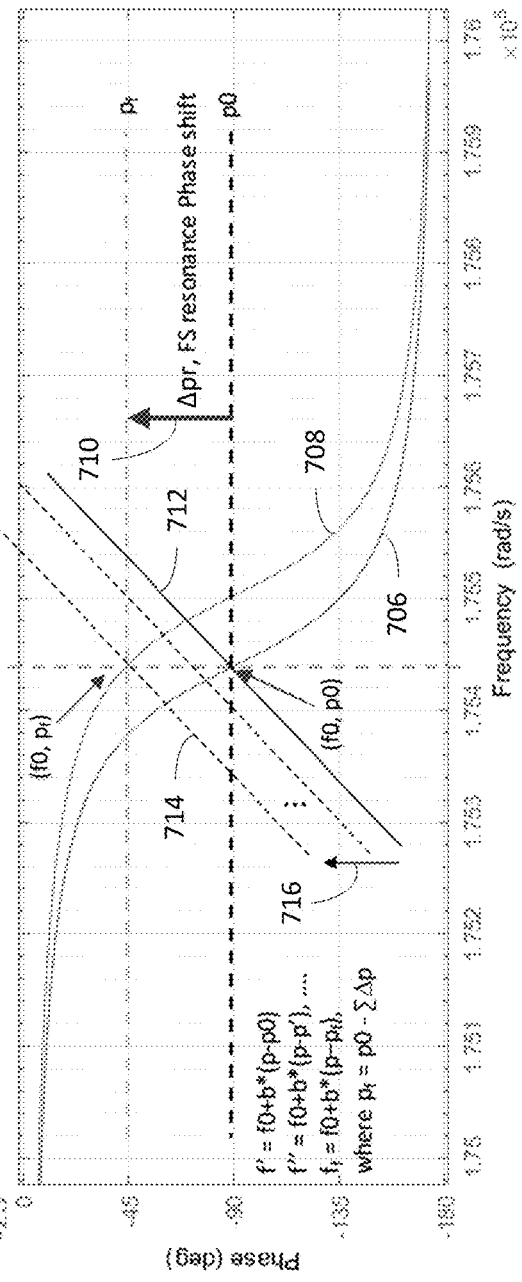

FIG. 7 is an example bode plot of a frequency response of the FS MEMS mirror illustrating interaction of the FS MEMS mirror operating under resonance and the adaptive VCO 600 shown in FIG. 6 in accordance with an embodiment. Curves 702 and 706 represent the frequency response (amplitude and phase, respectively) of the FS MEMS mirror prior to a shift of the resonance phase of the FS MEMS mirror. Curve 708 represents the frequency response (phase) of the FS MEMS mirror after the resonance phase of the FS MEMS mirror shifts by an amount, Δpr, as illustrated by arrow 710. Line 712 represents a relationship between the frequency, f, of the updated periodic drive signal 612 and a difference between the phase difference, p (between the phase of the updated periodic drive signal 612 and the phase corresponding to the position of the FS MEMS mirror) and the updated phase difference target 638.

As shown in FIG. 7, instead of having a fixed point of resonance (f0, p0) of the PLL as depicted in FIG. 3, the phase difference target of the adaptive PLL is updated during the PLL feedback process by integrating the phase changes:

$$f' = f0 + b*(p - p0)$$
$$f'' = f0 + b*(p - p')$$
$$\ldots$$
$$f_f = f0 + b*\left(\sum \Delta p + p - p0\right) = f0 + b*(p - pf),$$
$$\text{where } pf = p0 - \sum \Delta p$$

Accordingly, line 712 is adaptively shifted toward line 714 one step at a time, as indicated by arrow 716. $p_f$ converges when Δp=0 and $f_f$=f0 for the locked output frequency.

In an example embodiment, the functionality of the VCO 600 may be summarized by the following steps:
1. The adaptive VCO 600 starts at the initial phase difference target p0 as a regular VCO. After a period of time t0, the output of the adaptive VCO 600 stabilizes with output f0+b*(p−p0)=f0+b*Δp, where Δp is the error phase from the error signal (i.e., second phase difference 624).
2. The phase difference target update logic 646 starts and updates the new phase difference target to p'=p0−Δp.
3. The regular VCO starts again and stabilizes at f''=f0+ b*(p−p').
4. Step 2 and 3 are repeated. Effectively, the integrator sums Δp+Δp' and updates the phase difference target to: p0−(Δp+Δp' . . . )=p0−ΣΔp. As mentioned above, this process converges when Δp=0 and $f_f$=f0.

It should be noted that the functionality of the adaptive VCO 600 is not limited to any initial (f0, p0) (resonance is merely one example) or any specific technique for integrating the phase differences that are determined by the phase comparison logic 602.

Figure 8:
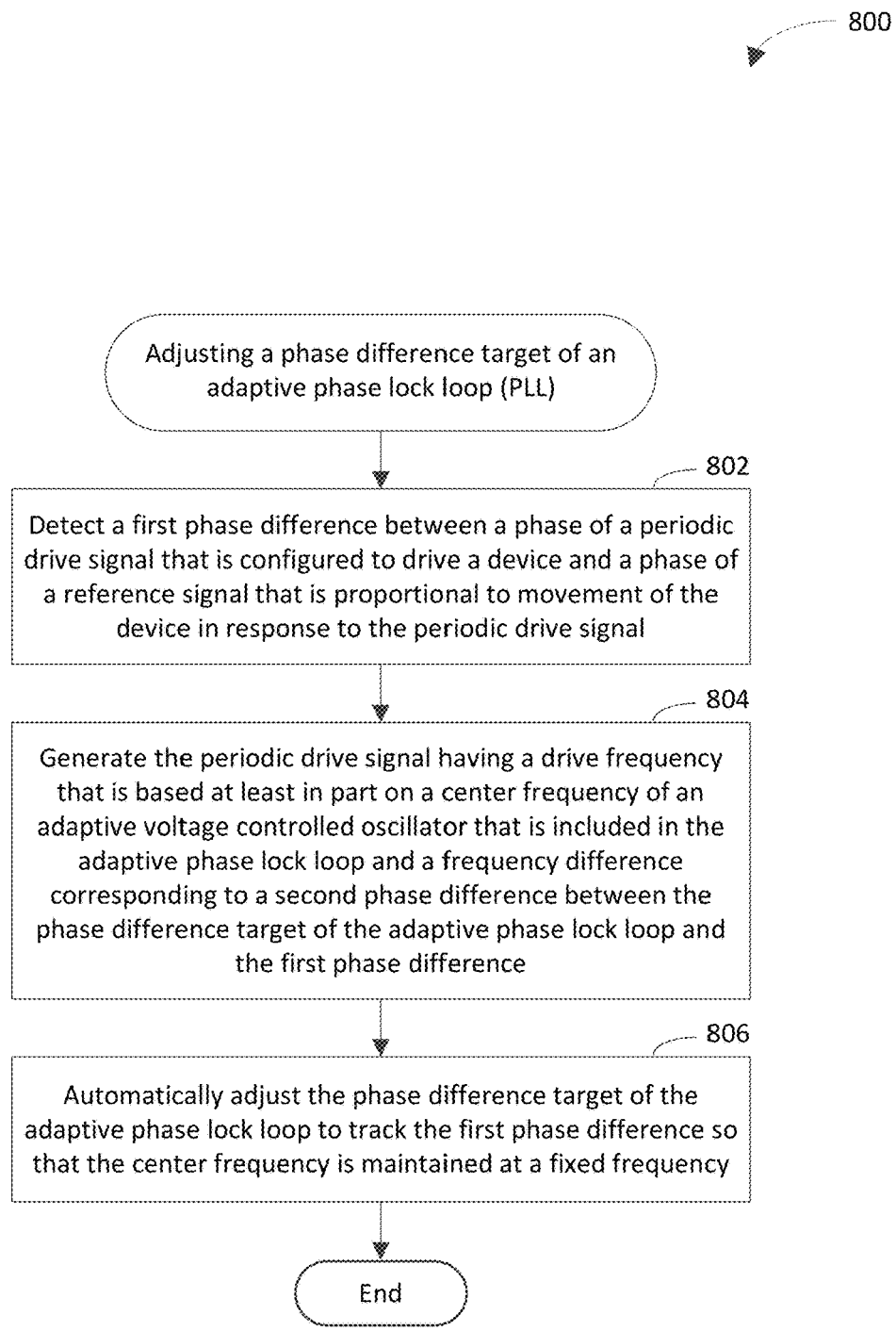
FIG. 8 depicts a flowchart of an example method for adjusting a phase difference target of an adaptive PLL in accordance with an embodiment.

FIG. 8 depicts a flowchart 800 of an example method for adjusting a phase difference target of an adaptive PLL in accordance with an embodiment. Flowchart 800 may be performed by the adaptive PLL 102 shown in FIG. 1, for example. For illustrative purposes, flowchart 800 is described with respect to the adaptive PLL 102 and the adaptive VCO 600 shown in FIG. 6, which is an example implementation of the adaptive VCO 108 in the adaptive PLL 102. Further structural and operational embodiments will be apparent to persons skilled in the relevant art(s) based on the discussion regarding flowchart 800.

As shown in FIG. 8, the method of flowchart 800 begins at step 802. In step 802, a first phase difference between a phase of a periodic drive signal that is configured to drive a device and a phase of a reference signal that is proportional to movement of the device in response to the periodic drive signal is detected. In an example implementation, the phase detector 106 detects a first phase difference 110 between a phase of the periodic drive signal 112 that is configured to drive the device 104 and a phase of the reference signal 114 that is proportional to movement of the device 104 in response to the periodic drive signal 112.

At step 804, the periodic drive signal is generated having a drive frequency that is based at least in part on a center frequency of an adaptive voltage controlled oscillator that is included in the adaptive phase lock loop and a frequency difference corresponding to a second phase difference between the phase difference target of the adaptive phase lock loop and the first phase difference. In an example implementation, the adaptive VCO 600 generates the periodic drive signal 112 having the drive frequency that is based at least in part on the center frequency 632 of the adaptive VCO 600 that is included in the adaptive PLL 102 and a frequency difference 626 corresponding to a second phase difference 624 between the phase difference target 122 of the adaptive PLL 102 and the first phase difference 110.

In an example embodiment, generating the periodic drive signal at step 804 includes causing the device to operate at a resonant frequency of the device. For instance, the drive frequency may be substantially equal to the resonant frequency of the device.

At step 806, the phase difference target of the adaptive phase lock loop is automatically adjusted to track the first phase difference between the phase of the periodic drive signal and the phase of the reference signal so that the center frequency is maintained at a fixed frequency. In an example implementation, the adaptive VCO 600 automatically adjusts the phase difference target 110 of the adaptive PLL 102 to track the phase of the periodic drive signal 112 so that the center frequency 632 is maintained at a fixed frequency.

In an example embodiment, automatically adjusting the phase difference target at step 806 includes integrating iterative representations of the second phase difference to provide an integrated phase difference. For instance, the integrator 618 may integrate the iterative representations of the second phase difference 624 to provide the integrated phase difference 650. In accordance with this embodiment, automatically adjusting the phase difference target at step 806 further includes combining an initial representation of the phase difference target of the adaptive phase lock loop and the integrated phase difference to provide an updated representation of the phase difference target of the adaptive phase lock loop. For instance, the second combiner 640 may combine the initial phase difference target 616 of the adaptive PLL 102 and the integrated phase difference 650 to provide the updated phase difference target 638 of the adaptive PLL 102.

In an aspect of this embodiment, automatically adjusting the phase difference target at step 806 further includes combining the center frequency of the adaptive voltage controlled oscillator and the frequency difference, which corresponds to the second phase difference, to provide combined frequencies. For instance, the first combiner 608 may combine the center frequency 632 of the adaptive VCO 600 and the frequency difference 626, which corresponds to the second phase difference 624, to provide the combined frequency indicator 636, which indicates the combined frequencies. In accordance with this aspect, generating the periodic drive signal at step 804 includes generating an updated representation of the periodic drive signal based at least in part on the combined frequencies. For instance, the oscillator 614 may generate the updated periodic drive signal 612 based at least in part on the combined frequencies.

In another example embodiment, automatically adjusting the phase difference target at step 806 includes maintaining resonance of the device by automatically adjusting the phase difference target of the adaptive phase lock loop to track the first phase difference between the phase of the periodic drive signal and the phase of the reference signal so that the center frequency is maintained at the fixed frequency.

In some example embodiments, one or more steps 802, 804, and/or 806 of flowchart 800 may not be performed. Moreover, steps in addition to or in lieu of steps 802, 804, and/or 806 may be performed.

Any one or more of the adaptive PLL 102, the phase detector 106, the adaptive VCO 108, the adaptive VCO 200, the phase comparison logic 202, the phase-to-frequency conversion logic 204, the center frequency update logic 206, the first combiner 208, the oscillator 214, the integrator 218, the second combiner 220, the phase comparison logic 602, the phase-to-frequency conversion logic 604, the first combiner 608, the oscillator 614, the integrator 618, the second combiner 640, the phase difference target update logic 646, flowchart 500, and/or flowchart 800 may be implemented in hardware, software, firmware, or any combination thereof.

For example, any one or more of the adaptive PLL 102, the phase detector 106, the adaptive VCO 108, the adaptive VCO 200, the phase comparison logic 202, the phase-to-frequency conversion logic 204, the center frequency update logic 206, the first combiner 208, the oscillator 214, the integrator 218, the second combiner 220, the phase comparison logic 602, the phase-to-frequency conversion logic 604, the first combiner 608, the oscillator 614, the integrator 618, the second combiner 640, the phase difference target update logic 646, flowchart 500, and/or flowchart 800 may be implemented, at least in part, as computer program code configured to be executed in one or more processors.

In another example, any one or more of the adaptive PLL 102, the phase detector 106, the adaptive VCO 108, the adaptive VCO 200, the phase comparison logic 202, the phase-to-frequency conversion logic 204, the center frequency update logic 206, the first combiner 208, the oscillator 214, the integrator 218, the second combiner 220, the phase comparison logic 602, the phase-to-frequency conversion logic 604, the first combiner 608, the oscillator 614, the integrator 618, the second combiner 640, the phase difference target update logic 646, flowchart 500, and/or flowchart 800 may be implemented, at least in part, as hardware logic/electrical circuitry. Such hardware logic/electrical circuitry may include one or more hardware logic components. Examples of a hardware logic component include but are not limited to a field-programmable gate array (FPGA), an application-specific integrated circuit (ASIC), an application-specific standard product (ASSP), a system-on-a-chip system (SoC), a complex programmable logic device (CPLD), etc. For instance, a SoC may include an integrated circuit chip that includes one or more of a processor (e.g., a microcontroller, microprocessor, digital signal processor (DSP), etc.), memory, one or more communication interfaces, and/or further circuits and/or embedded firmware to perform its functions.

III. Further Discussion of Some Example Embodiments

A first example adaptive phase lock loop comprises a phase detector and an adaptive voltage controlled oscillator. The phase detector is configured to detect a first phase difference between a phase of a periodic drive signal that is configured to drive a device and a phase of a reference signal that is proportional to movement of the device in response to the periodic drive signal. The adaptive voltage controlled oscillator is configured to generate the periodic drive signal having a drive frequency that is based at least in part on a center frequency of the adaptive voltage controlled oscillator and a frequency difference associated with a second phase difference between a phase difference target of the adaptive phase lock loop and the first phase difference. The adaptive voltage controlled oscillator is further configured to automatically adjust the center frequency of the adaptive voltage controlled oscillator to track a frequency of the periodic drive signal so that the first phase difference is locked to the phase difference target of the first example adaptive phase lock loop.

In a first aspect of the first example adaptive phase lock loop, the adaptive voltage controlled oscillator comprises an integrator and a first combiner. The integrator is configured to integrate a plurality of iterative representations of the frequency difference associated with a plurality of respective iterative representations of the second phase difference to provide an integrated frequency difference in response to the iterative representations of the frequency difference stabilizing. The first combiner is configured to combine an initial representation of the center frequency of the adaptive voltage controlled oscillator and the integrated frequency difference to provide an updated representation of the center frequency of the adaptive voltage controlled oscillator.

In an example of the first aspect, the adaptive voltage controlled oscillator further comprises a second combiner and an oscillator. The second combiner is configured to combine the updated representation of the center frequency of the adaptive voltage controlled oscillator and a representation of the frequency difference that is based at least in part on the phase of the updated representation of the center frequency of the adaptive voltage controlled oscillator to provide combined frequencies. The oscillator is configured to generate an updated representation of the periodic drive signal based at least in part on the combined frequencies.

In a second aspect of the first example adaptive phase lock loop, the periodic drive signal is configured to cause the device to operate at a resonant frequency of the device. The second aspect of the first example adaptive phase lock loop may be implemented in combination with the first aspect of the first example adaptive phase lock loop, though the example embodiments are not limited in this respect.

In a third aspect of the first example adaptive phase lock loop, the adaptive voltage controlled oscillator is configured to maintain resonance of the device by automatically adjusting the center frequency of the adaptive voltage controlled oscillator to track the frequency of the periodic drive signal so that the first phase difference is locked to the phase difference target. The third aspect of the first example adaptive phase lock loop may be implemented in combination with the first and/or second aspect of the first example adaptive phase lock loop, though the example embodiments are not limited in this respect.

In a fourth aspect, a control system comprises the first example adaptive phase lock loop. In accordance with the fourth aspect, the device is a scan MEMS mirror. In further accordance with the fourth aspect, the control system further comprises the scan MEMS mirror configured to generate the reference signal by oscillating about an axis in response to the periodic drive signal. The fourth aspect may be implemented in combination with the first, second, and/or third aspect of the first example adaptive phase lock loop, though the example embodiments are not limited in this respect.

In an example of the fourth aspect, the scan MEMS mirror is a fast scan MEMS mirror. In accordance with this example, the control system further comprises a slow scan MEMS mirror configured to oscillate about an axis that is perpendicular to the axis about which the fast scan MEMS mirror is configured to oscillate. In further accordance with this example, the fast scan MEMS mirror and the slow scan MEMS mirror are configured to collaboratively perform a raster scan of light for display.

In a first example method of adjusting a center frequency of an adaptive voltage controlled oscillator, a first phase difference between a phase of a periodic drive signal that is configured to drive a device and a phase of a reference signal that is proportional to movement of the device in response to the periodic drive signal is detected. The periodic drive signal is generated having a drive frequency that is based at least in part on the center frequency of the adaptive voltage controlled oscillator and a frequency difference associated with a second phase difference between a phase difference target of an adaptive phase lock loop that includes the adaptive voltage controlled oscillator and the first phase difference. The center frequency of the adaptive voltage controlled oscillator is automatically adjusted to track a frequency of the periodic drive signal so that the first phase difference is locked to the phase difference target.

In a first aspect of the first example method, automatically adjusting the center frequency of the adaptive voltage controlled oscillator comprises integrating a plurality of iterative representations of the frequency difference associated with a plurality of respective iterative representations of the second phase difference to provide an integrated frequency difference. In accordance with the first aspect, automatically adjusting the center frequency of the adaptive voltage controlled oscillator further comprises combining an initial representation of the center frequency of the adaptive voltage controlled oscillator and the integrated frequency difference to provide an updated representation of the center frequency of the adaptive voltage controlled oscillator.

In an example of the first aspect, automatically adjusting the center frequency of the adaptive voltage controlled oscillator further comprises combining the updated representation of the center frequency of the adaptive voltage controlled oscillator and a representation of the frequency difference that is based at least in part on the phase of the updated representation of the center frequency of the adaptive voltage controlled oscillator to provide combined frequencies. In accordance with this example, generating the periodic drive signal comprises generating an updated representation of the periodic drive signal based at least in part on the combined frequencies.

In a second aspect of the first example method, generating the periodic drive signal comprises causing the device to operate at a resonant frequency of the device. The second aspect of the first example method may be implemented in combination with the first aspect of the first example method, though the example embodiments are not limited in this respect.

In a third aspect of the first example method, automatically adjusting the center frequency of the adaptive voltage controlled oscillator comprises maintaining resonance of the device by automatically adjusting the center frequency of the adaptive voltage controlled oscillator to track the frequency of the periodic drive signal so that the first phase difference is locked to the phase difference target. The third aspect of the first example method may be implemented in combination with the first and/or second aspect of the first example method, though the example embodiments are not limited in this respect.

A second example adaptive phase lock loop comprises a phase detector and an adaptive voltage controlled oscillator. The phase detector is configured to detect a first phase difference between a phase of a periodic drive signal that is configured to drive a device and a phase of a reference signal that is proportional to movement of the device in response to the periodic drive signal. The adaptive voltage controlled oscillator is configured to generate the periodic drive signal having a drive frequency that is based at least in part on a center frequency of the adaptive voltage controlled oscillator and a frequency difference corresponding to a second phase difference between a phase difference target of the adaptive phase lock loop and the first phase difference. The adaptive voltage controlled oscillator is further configured to automatically adjust the phase difference target of the adaptive phase lock loop to track the first phase difference between the phase of the periodic drive signal and the phase of the reference signal so that the center frequency is maintained at a fixed frequency.

In a first aspect of the second example adaptive phase lock loop, the adaptive voltage controlled oscillator comprises an integrator and a first combiner. The integrator is configured to integrate a plurality of iterative representations of the second phase difference to provide an integrated phase difference in response to the iterative representations of the second phase difference stabilizing. The first combiner is configured to combine an initial representation of the phase difference target of the adaptive phase lock loop and the integrated phase difference to provide an updated representation of the phase difference target of the adaptive phase lock loop.

In an example of the first aspect, the adaptive voltage controlled oscillator further comprises a second combiner and an oscillator. The second combiner is configured to combine the center frequency of the adaptive voltage controlled oscillator and the frequency difference, which corresponds to the second phase difference, to provide combined frequencies. The oscillator is configured to generate an updated representation of the periodic drive signal based at least in part on the combined frequencies.

In a second aspect of the second example adaptive phase lock loop, the periodic drive signal is configured to cause the device to operate at a resonant frequency of the device. The second aspect of the second example adaptive phase lock loop may be implemented in combination with the first aspect of the second example adaptive phase lock loop, though the example embodiments are not limited in this respect.

In a third aspect of the second example adaptive phase lock loop, the adaptive voltage controlled oscillator is configured to maintain resonance of the device by automatically adjusting the phase difference target of the adaptive phase lock loop to track the first phase difference between the phase of the periodic drive signal and the phase of the reference signal so that the center frequency is maintained at the fixed frequency. The third aspect of the second example adaptive phase lock loop may be implemented in combination with the first and/or second aspect of the second example adaptive phase lock loop, though the example embodiments are not limited in this respect.

In a fourth aspect, a control system comprises the second example adaptive phase lock loop. In accordance with the fourth aspect, the device is a scan MEMS mirror. In further accordance with the fourth aspect, the control system further comprises the scan MEMS mirror configured to generate the reference signal by oscillating about an axis in response to the periodic drive signal. The fourth aspect may be implemented in combination with the first, second, and/or third aspect of the second example adaptive phase lock loop, though the example embodiments are not limited in this respect.

In an example of the fourth aspect, the scan MEMS mirror is a fast scan MEMS mirror. In accordance with this example, the control system further comprises a slow scan MEMS mirror configured to oscillate about an axis that is perpendicular to the axis about which the fast scan MEMS mirror is configured to oscillate. In further accordance with this example, the fast scan MEMS mirror and the slow scan MEMS mirror are configured to collaboratively perform a raster scan of light for display.

In a second example method of adjusting a phase difference target of an adaptive phase lock loop, a first phase difference between a phase of a periodic drive signal that is configured to drive a device and a phase of a reference signal that is proportional to movement of the device in response to the periodic drive signal is detected. The periodic drive signal is generated having a drive frequency that is based at least in part on a center frequency of an adaptive voltage controlled oscillator that is included in the adaptive phase lock loop and a frequency difference corresponding to a second phase difference between the phase difference target of the adaptive phase lock loop and the first phase difference. The phase difference target of the adaptive phase lock loop is automatically adjusted to track the first phase difference between the phase of the periodic drive signal and the phase of the reference signal so that the center frequency is maintained at a fixed frequency.

In a first aspect of the second example method, automatically adjusting the phase difference target of the adaptive phase lock loop comprises integrating a plurality of iterative representations of the second phase difference to provide an integrated phase difference. In accordance with the first aspect, automatically adjusting the phase difference target of the adaptive phase lock loop further comprises combining an initial representation of the phase difference target of the adaptive phase lock loop and the integrated phase difference to provide an updated representation of the phase difference target of the adaptive phase lock loop.

In an example of the first aspect, automatically adjusting the phase difference target of the adaptive phase lock loop further comprises combining the center frequency of the adaptive voltage controlled oscillator and the frequency difference, which corresponds to the second phase difference, to provide combined frequencies. In accordance with this example, generating the periodic drive signal comprises generating an updated representation of the periodic drive signal based at least in part on the combined frequencies.

In a second aspect of the second example method, generating the periodic drive signal comprises causing the device to operate at a resonant frequency of the device. The second aspect of the second example method may be implemented in combination with the first aspect of the second example method, though the example embodiments are not limited in this respect.

In a third aspect of the second example method, automatically adjusting the phase difference target of the adaptive phase lock loop comprises maintaining resonance of the device by automatically adjusting the phase difference target of the adaptive phase lock loop to track the first phase difference between the phase of the periodic drive signal and the phase of the reference signal so that the center frequency is maintained at the fixed frequency. The third aspect of the second example method may be implemented in combination with the first and/or second aspect of the second example method, though the example embodiments are not limited in this respect.

A first example computer program product comprises a computer-readable storage medium having instructions recorded thereon for enabling a processor-based system to perform operations to adjust a center frequency of an adaptive voltage controlled oscillator. The operations comprise detect a first phase difference between a phase of a periodic drive signal that is configured to drive a device and a phase of a reference signal that is proportional to movement of the device in response to the periodic drive signal. The operations further comprise generate the periodic drive signal having a drive frequency that is based at least in part on the center frequency of the adaptive voltage controlled oscillator and a frequency difference associated with a second phase difference between a phase difference target of an adaptive phase lock loop that includes the adaptive voltage controlled oscillator and the first phase difference. The operations further comprise automatically adjust the center frequency of the adaptive voltage controlled oscillator to track a frequency of the periodic drive signal so that the first phase difference is locked to a phase difference target of the adaptive phase lock loop.

A second example computer program product comprises a computer-readable storage medium having instructions recorded thereon for enabling a processor-based system to perform operations to perform operations to adjust a phase difference target of an adaptive phase lock loop. The operations comprise detect a first phase difference between a phase of a periodic drive signal that is configured to drive a device and a phase of a reference signal that is proportional to movement of the device in response to the periodic drive signal. The operations further comprise generate the periodic drive signal having a drive frequency that is based at least in part on a center frequency of an adaptive voltage controlled oscillator that is included in the adaptive phase lock loop and a frequency difference corresponding to a second phase difference between the phase difference target of the adaptive phase lock loop and the first phase difference. The operations further comprise automatically adjust the phase difference target of the adaptive phase lock loop to track the first phase difference between the phase of the periodic drive signal and the phase of the reference signal so that the center frequency is maintained at a fixed frequency.

IV. Example Computer System

Figure 9:
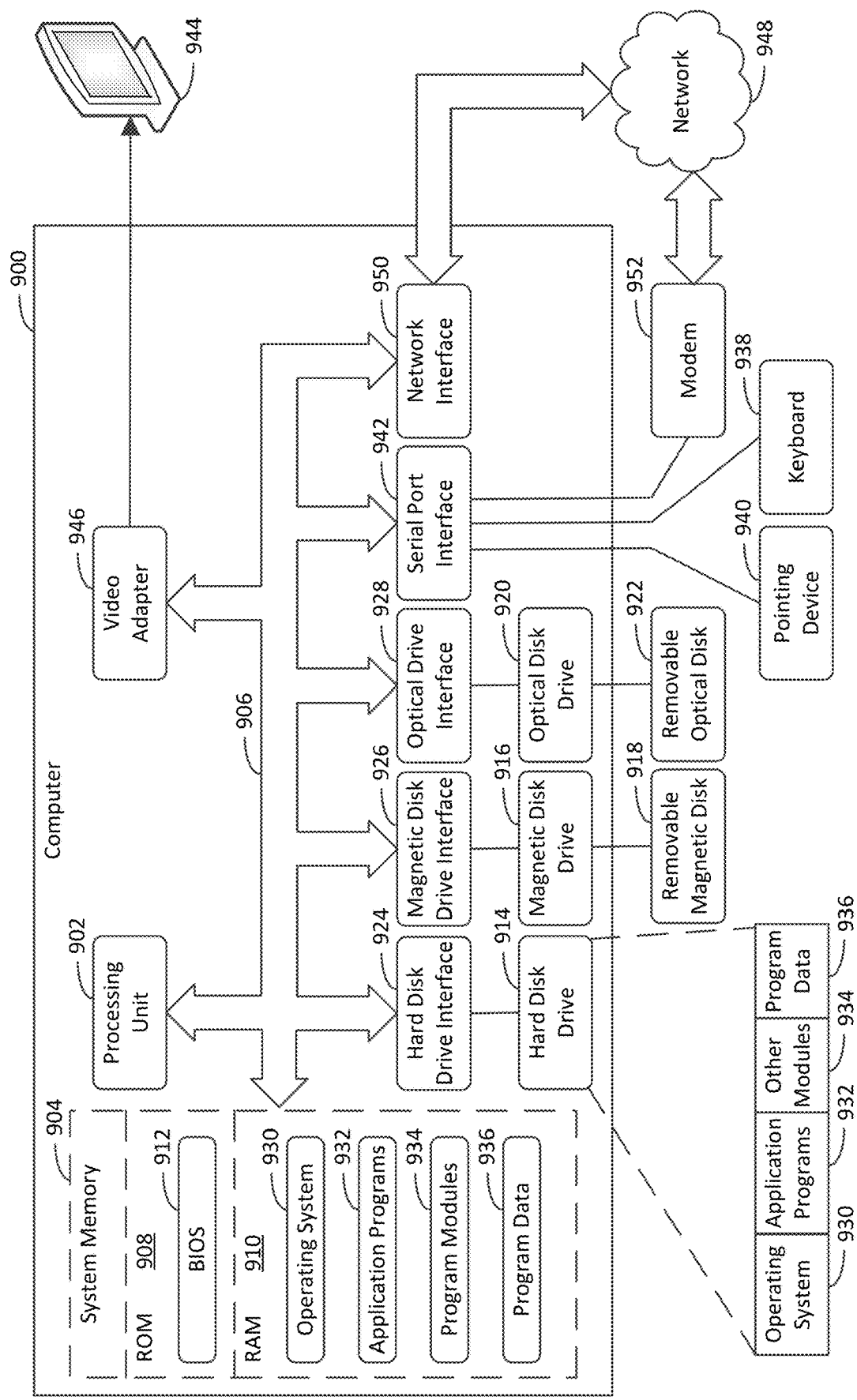
FIG. 9 depicts an example computer in which embodiments may be implemented.

FIG. 9 depicts an example computer 900 in which embodiments may be implemented. The control system 100 may be implemented using computer 900, including one or more features of computer 900 and/or alternative features. Computer 900 may be a general-purpose computing device in the form of a conventional personal computer, a mobile computer, or a workstation, for example, or computer 900 may be a special purpose computing device. For instance, computer 900 may be a desktop computer, a laptop computer, a tablet computer, a wearable computer such as a smart watch or a head-mounted computer, a personal digital assistant, a cellular telephone, an Internet of things (IoT) device, or the like. The description of computer 900 provided herein is provided for purposes of illustration, and is not intended to be limiting. Embodiments may be implemented in further types of computer systems, as would be known to persons skilled in the relevant art(s).

As shown in FIG. 9, computer 900 includes a processing unit 902, a system memory 904, and a bus 906 that couples various system components including system memory 904 to processing unit 902. Bus 906 represents one or more of any of several types of bus structures, including a memory bus or memory controller, a peripheral bus, an accelerated graphics port, and a processor or local bus using any of a variety of bus architectures. System memory 904 includes read only memory (ROM) 908 and random access memory (RAM) 910. A basic input/output system 912 (BIOS) is stored in ROM 908.

Computer 900 also has one or more of the following drives: a hard disk drive 914 for reading from and writing to a hard disk, a magnetic disk drive 916 for reading from or writing to a removable magnetic disk 918, and an optical disk drive 920 for reading from or writing to a removable optical disk 922 such as a CD ROM, DVD ROM, or other optical media. Hard disk drive 914, magnetic disk drive 916, and optical disk drive 920 are connected to bus 906 by a hard disk drive interface 924, a magnetic disk drive interface 926, and an optical drive interface 928, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 930, one or more application programs 932, other program modules 934, and program data 936. Application programs 932 or program modules 934 may include, for example, computer program logic for implementing any one or more of the adaptive PLL 102, the phase detector 106, the adaptive VCO 108, the adaptive VCO 200, the phase comparison logic 202, the phase-to-frequency conversion logic 204, the center frequency update logic 206, the first combiner 208, the oscillator 214, the integrator 218, the second combiner 220, the phase comparison logic 602, the phase-to-frequency conversion logic 604, the first combiner 608, the oscillator 614, the integrator 618, the second combiner 640, the phase difference target update logic 646, flowchart 500 (including any step of flowchart 500), and/or flowchart 800 (including any step of flowchart 800), as described herein.

A user may enter commands and information into the computer 900 through input devices such as keyboard 938 and pointing device 940. Other input devices (not shown) may include a microphone, joystick, game pad, satellite dish, scanner, touch screen, camera, accelerometer, gyroscope, or the like. These and other input devices are often connected to the processing unit 902 through a serial port interface 942 that is coupled to bus 906, but may be connected by other interfaces, such as a parallel port, game port, or a universal serial bus (USB).

A display device 944 (e.g., a monitor) is also connected to bus 906 via an interface, such as a video adapter 946. In addition to display device 944, computer 900 may include other peripheral output devices (not shown) such as speakers and printers.

Computer 900 is connected to a network 948 (e.g., the Internet) through a network interface or adapter 950, a modem 952, or other means for establishing communications over the network. Modem 952, which may be internal or external, is connected to bus 906 via serial port interface 942.

As used herein, the terms "computer program medium" and "computer-readable storage medium" are used to generally refer to media (e.g., non-transitory media) such as the hard disk associated with hard disk drive 914, removable magnetic disk 918, removable optical disk 922, as well as other media such as flash memory cards, digital video disks, random access memories (RAMs), read only memories (ROM), and the like. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media.

As noted above, computer programs and modules (including application programs 932 and other program modules 934) may be stored on the hard disk, magnetic disk, optical disk, ROM, or RAM. Such computer programs may also be received via network interface 950 or serial port interface 942. Such computer programs, when executed or loaded by an application, enable computer 900 to implement features of embodiments discussed herein. Accordingly, such computer programs represent controllers of the computer 900.

Example embodiments are also directed to computer program products comprising software (e.g., computer-readable instructions) stored on any computer-useable medium. Such software, when executed in one or more data processing devices, causes data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

It will be recognized that the disclosed technologies are not limited to any particular computer or type of hardware. Certain details of suitable computers and hardware are well known and need not be set forth in detail in this disclosure.

V. Conclusion

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. An adaptive phase lock loop comprising:
    a phase detector configured to detect a first phase difference between a phase of a periodic drive signal that is configured to drive a device and a phase of a reference signal that is proportional to movement of the device in response to the periodic drive signal; and
    an adaptive voltage controlled oscillator configured to generate the periodic drive signal having a drive frequency that is based at least in part on a center frequency of the adaptive voltage controlled oscillator and a frequency difference corresponding to a second phase difference between a phase difference target of the adaptive phase lock loop and the first phase difference, the adaptive voltage controlled oscillator further configured to automatically adjust the phase difference target of the adaptive phase lock loop to track the first phase difference between the phase of the periodic drive signal and the phase of the reference signal so that the center frequency is maintained at a fixed frequency.

2. The adaptive phase lock loop of claim 1, wherein the adaptive voltage controlled oscillator comprises:
    an integrator configured to integrate a plurality of iterative representations of the second phase difference to provide an integrated phase difference in response to the iterative representations of the second phase difference stabilizing; and
    a first combiner configured to combine an initial representation of the phase difference target of the adaptive phase lock loop and the integrated phase difference to provide an updated representation of the phase difference target of the adaptive phase lock loop.

3. The adaptive phase lock loop of claim 2, wherein the integrator is configured to integrate the plurality of iterative representations of the second phase difference based at least in part on a threshold period of time passing since the second phase difference was initially received by the integrator.

4. The adaptive phase lock loop of claim 2, wherein the integrator is configured to integrate the plurality of iterative representations of the second phase difference based at least in part on the iterative representations of the second phase difference varying less than or equal to a threshold amount.

5. The adaptive phase lock loop of claim 2, wherein the integrator is configured to down-sample the plurality of iterative representations of the second phase difference prior to integrating the plurality of iterative representations of the second phase difference to provide the integrated phase difference;
    wherein the integrator is further configured to up-sample the integrated phase difference; and
    wherein the first combiner is configured to combine the initial representation of the phase difference target of the adaptive phase lock loop and the integrated phase difference in response to the integrated phase difference being up-sampled by the integrator.

6. The adaptive phase lock loop of claim 2, wherein the adaptive voltage controlled oscillator further comprises:
    a second combiner configured to combine the center frequency of the adaptive voltage controlled oscillator and the frequency difference, which corresponds to the second phase difference, to provide combined frequencies; and an oscillator configured to generate an updated representation of the periodic drive signal based at least in part on the combined frequencies.

7. The adaptive phase lock loop of claim 1, wherein the periodic drive signal is configured to cause the device to operate at a resonant frequency of the device.

8. The adaptive phase lock loop of claim 1, wherein the adaptive voltage controlled oscillator is configured to maintain resonance of the device by automatically adjusting the phase difference target of the adaptive phase lock loop to track the first phase difference between the phase of the periodic drive signal and the phase of the reference signal so that the center frequency is maintained at the fixed frequency.

9. A method of adjusting a phase difference target of an adaptive phase lock loop, the method comprising:
   detecting a first phase difference between a phase of a periodic drive signal that is configured to drive a device and a phase of a reference signal that is proportional to movement of the device in response to the periodic drive signal;
   generating the periodic drive signal having a drive frequency that is based at least in part on a center frequency of an adaptive voltage controlled oscillator that is included in the adaptive phase lock loop and a frequency difference corresponding to a second phase difference between the phase difference target of the adaptive phase lock loop and the first phase difference; and
   automatically adjusting the phase difference target of the adaptive phase lock loop to track the first phase difference between the phase of the periodic drive signal and the phase of the reference signal so that the center frequency is maintained at a fixed frequency.

10. The method of claim 9, wherein automatically adjusting the phase difference target of the adaptive phase lock loop comprises:
    integrating a plurality of iterative representations of the second phase difference to provide an integrated phase difference; and
    combining an initial representation of the phase difference target of the adaptive phase lock loop and the integrated phase difference to provide an updated representation of the phase difference target of the adaptive phase lock loop.

11. The method of claim 10, wherein integrating the plurality of iterative representations of the second phase difference comprises:
    integrating the plurality of iterative representations of the second phase difference based at least in part on the iterative representations of the second phase difference varying less than or equal to ten percent.

12. The method of claim 10, wherein automatically adjusting the phase difference target of the adaptive phase lock loop further comprises:
    combining the center frequency of the adaptive voltage controlled oscillator and the frequency difference, which corresponds to the second phase difference, to provide combined frequencies; and
    wherein generating the periodic drive signal comprises:
      generating an updated representation of the periodic drive signal based at least in part on the combined frequencies.

13. The method of claim 9, wherein generating the periodic drive signal comprises:
    causing the device to operate at a resonant frequency of the device.

14. The method of claim 9, wherein automatically adjusting the phase difference target of the adaptive phase lock loop comprises:
    maintaining resonance of the device by automatically adjusting the phase difference target of the adaptive phase lock loop to track the first phase difference between the phase of the periodic drive signal and the phase of the reference signal so that the center frequency is maintained at the fixed frequency.

15. A control system comprising:
    an adaptive phase lock loop comprising:
      a phase detector configured to detect a first phase difference between a phase of a periodic drive signal that is configured to drive a scan MEMS mirror and a phase of a reference signal that is proportional to movement of the scan MEMS mirror in response to the periodic drive signal; and
      an adaptive voltage controlled oscillator configured to generate the periodic drive signal having a drive frequency that is based at least in part on a center frequency of the adaptive voltage controlled oscillator and a frequency difference corresponding to a second phase difference between a phase difference target of the adaptive phase lock loop and the first phase difference, the adaptive voltage controlled oscillator further configured to automatically adjust the phase difference target of the adaptive phase lock loop to track the first phase difference between the phase of the periodic drive signal and the phase of the reference signal so that the center frequency is maintained at a fixed frequency; and
    the scan MEMS mirror configured to generate the reference signal by oscillating about an axis in response to the periodic drive signal.

16. The control system of claim 15, wherein the scan MEMS mirror is a fast scan MEMS mirror;
    wherein the control system further comprises:
      a slow scan MEMS mirror configured to oscillate about an axis that is perpendicular to the axis about which the fast scan MEMS mirror is configured to oscillate; and
    wherein the fast scan MEMS mirror and the slow scan MEMS mirror are configured to collaboratively perform a raster scan of light for display.

17. The control system of claim 15, wherein the adaptive voltage controlled oscillator comprises:
    an integrator configured to integrate a plurality of iterative representations of the second phase difference to provide an integrated phase difference in response to the iterative representations of the second phase difference stabilizing; and
    a first combiner configured to combine an initial representation of the phase difference target of the adaptive phase lock loop and the integrated phase difference to provide an updated representation of the phase difference target of the adaptive phase lock loop.

18. The control system of claim 17, wherein the adaptive voltage controlled oscillator further comprises:
    a second combiner configured to combine the center frequency of the adaptive voltage controlled oscillator and the frequency difference, which corresponds to the second phase difference, to provide combined frequencies; and
    an oscillator configured to generate an updated representation of the periodic drive signal based at least in part on the combined frequencies.

19. The control system of claim 15, wherein the periodic drive signal is configured to cause the scan MEMS mirror to operate at a resonant frequency of the scan MEMS mirror.

20. The control system of claim 15, wherein the adaptive voltage controlled oscillator is configured to maintain resonance of the scan MEMS mirror by automatically adjusting the phase difference target of the adaptive phase lock loop to track the first phase difference between the phase of the periodic drive signal and the phase of the reference signal so that the center frequency is maintained at the fixed frequency.

* * * * *